United States Patent [19]
Frey et al.

[11] Patent Number: 5,631,968
[45] Date of Patent: May 20, 1997

[54] SIGNAL CONDITIONING CIRCUIT FOR COMPRESSING AUDIO SIGNALS

[75] Inventors: Douglas R. Frey, Bethlehem, Pa.; Patrick Copley, Sunnyvale, Calif.

[73] Assignee: Analog Devices, Inc., Norwood, Mass.

[21] Appl. No.: 469,440

[22] Filed: Jun. 6, 1995

[51] Int. Cl.[6] .................................................. H03G 7/00
[52] U.S. Cl. ................................................. 381/106; 333/14
[58] Field of Search ..................................... 381/106, 107, 381/108; 333/14

[56] References Cited

U.S. PATENT DOCUMENTS

| | | | |
|---|---|---|---|
| 3,919,654 | 11/1975 | Toumani | 333/14 |
| 4,377,792 | 3/1983 | Blackmer et al. | 333/14 |
| 4,466,119 | 8/1984 | Peters et al. | 381/106 |
| 4,539,692 | 9/1985 | Munter | 381/107 |
| 4,696,044 | 9/1987 | Waller, Jr. | 381/106 |
| 4,891,837 | 1/1990 | Walker et al. | 381/106 |
| 5,396,562 | 3/1995 | Ishimitsu et al. | 333/14 |
| 5,404,315 | 4/1995 | Nakano et al. | 381/106 |

OTHER PUBLICATIONS

"AGC Microphone and Power Amplifier", model CS4611 produced by Crystal Semiconductor of Austin, Texas, Dec. 1992.

"AGC Microphone and Power AMP", model MVA611 produced by Media Vision, Inc. of Fremont, California, Sep. 1992.

"Record/Playback Circuit with ALC", model TDA7284 produced by SGS-Thomson Microelectronics of St. Genif Pouilly, France, May 1991.

"Bipolar Linear Integrated Circuit Silicon Monolithic", model TA2011S produced by Toshiba Corporation of Tokyo, Japan, Sep. 1991.

Precision Monolithics, Inc., AN-133, AN-116 and AN134.

D. Sheingold, "Nonlinear Circuits Handbook", Analog Devices, Inc., pp. 398-403, 1976.

"Voltage-Controlled Amplifier/OVCE", model SSM-2018 produced by Analog Devices, Inc., 1981.

*Primary Examiner*—Forester W. Isen
*Attorney, Agent, or Firm*—Koppel & Jacobs

[57] ABSTRACT

A signal conditioning circuit compresses an audio signal by producing a gain signal that is a function of the time-averaged audio signal and a compression ratio, and amplifying the audio signal by an exponential function of the gain signal. The conditioning circuit merges the functions of buffering the audio signal and producing a full-wave rectified version of the audio signal into a single buffer circuit. An averaging circuit generates a time-averaged signal in response to the full-wave rectified signal. An interface circuit includes downward expansion, compression and limiting circuits for scaling the time-averaged signal with a low compression ratio when it is less than a break point, with a selected compression ratio when it is between the break point and a rotation point, and with a high compression ratio when it exceeds the rotation point. The interface circuit produces the gain signal in response to the time-averaged signal and the corresponding compression ratio. A voltage controlled amplifier amplifies the buffered input signal by an exponential function of the gain signal to produce a compressed output signal.

36 Claims, 6 Drawing Sheets

SIGNAL CONDITIONING CIRCUIT FOR COMPRESSING AUDIO SIGNALS

BACKGROUND OF THE INVENTION

1. Field of the Invention

The present invention generally relates to signal conditioning circuits, and more specifically to a signal conditioning circuit that merges buffering and rectification functions and provides downward expansion, variable compression and limiting capabilities.

2. Description of the Related Art

Audio systems such as public address (PA) and digital computer multi-media systems receive audio signals through microphone inputs. PA systems use power amplifiers to amplify the signals through a speaker system while multi-media computers digitize the inputs for storage, processing or playback. The audio signals are typically provided by a person speaking into the microphone.

Often the speaker is not experienced or comfortable with using a microphone, and may hold the microphone too close or too far away or may move the microphone around as he speaks. Furthermore, a person giving a presentation may be moving back-and-forth with respect to the microphone. In a PA system, this will cause the amplified signal to become very loud, and possibly distort, or fade in and out. Similarly, the computer will record a signal whose dynamic range varies due to the fluctuations in the detected audio signal.

To reduce the unnatural and annoying variances in the amplified or recorded audio signal, these systems use conditioning circuits to compress the dynamic range of the output audio signal such that faint signals are boosted and loud signals are attenuated. This improves the perceptual quality or vocal clarity of the signal. The amount of compression in the conditioning circuit is given by a compression ratio r, which is the ratio of the amplitude change of the RMS input audio signal compared to the amplitude change of the RMS output audio signal in decibels (dB). At one extreme a compression ratio of 1:1 produces no compression, while at the other extreme the RMS value of the output is held constant regardless of the input level (this is commonly referred to as an infinite ratio). When plotted in dB, a given circuit's compression curve is generally a straight line whose slope is the compression ratio. If the compression ratio can be varied, the lines for different ratios will generally intersect at a fixed reference point called the rotation point. At the rotation point, the circuit's gain is the same for all of its available compression ratios.

At an infinite compression ratio, variances in the output audio signal that would otherwise result from an improper use of a microphone are eliminated. However, the natural dynamic range of speech (the input audio signal) is also lost. In general, if the compression ratio is too large, the output signal amplitude will flatten out and very low noise signals will be amplified. If the compression ratio is too small, the microphone input problems will remain and the output may saturate or clip for large signals. The best perceptual audio quality is usually achieved between compression ratios of 2:1 and 10:1.

Conditioning circuits such as those described in product data sheets for an "AGC Microphone and Power Amplifier," model CS4611 produced by Crystal Semiconductor of Austin, Tex., December, 1992, and an "AGC Microphone and Power AMP," model MVA611 produced by Media Vision, Inc. of Fremont, Calif., September, 1992, include separate input buffer and level detection circuits, and are packaged in 24 and 28 pin packages, respectively. The input buffer presents a high impedance to the microphone and outputs a buffer signal. The level detection circuit includes both a full-wave rectifier and a root-mean-square (RMS) circuit for computing the RMS value of the input signal. Blocking capacitors are connected at the input to the level detection circuit, and between the input buffer and a voltage controlled amplifier (VCA) to prevent small DC currents in the conditioning circuitry from adversely affecting accuracy of the VCA and the level detection circuit.

An interface circuit produces a gain signal in response to the RMS input signal and a preset compression ratio. The VCA amplifies the buffer signal by an exponential function of the gain signal to produce a compressed output signal. The compression ratio can be adjusted externally to balance the competing interests of good signal quality in the desired audio range, reduced clipping and saturation for excessively large signals, and minimal amplification of noise signals. However, when the compression ratio provides enough compression to reduce the fluctuations in the audio signal without completely flattening the speaker's dynamic range, there is insufficient amplitude limiting of large signals, resulting in clipping and distortion. Furthermore, when the person is not speaking the noise level is amplified considerably.

Another type of conditioning circuit, such as described in the product data sheet for a "Record/Playback Circuit with ALC," model TDA7284 produced by SGS-Thomson Microelectronics of St. Genif Pouilly, France, May, 1991, and a "Bipolar Linear Integrated Circuit Silicon Monolithic," model TA2011S produced by Toshiba Corporation of Tokyo, Japan, September, 1991, uses feedback to control the signal compression. The conditioning circuit's compressed output signal is fed back to scale the input signal, so that an approximately constant signal value is input to the fixed gain amplifier that produces the compressed output signal. These circuits are Full Automatic Gain Control (AGC) circuits with an infinite compression ratio, and suffer from the problems mentioned above that are associated with infinite compression ratios.

Analog Devices, Inc., the assignee of the present invention, produces audio circuits AN-133, AN-116 and AN-134 that incorporate signal conditioning. The conditioning circuitry uses a buffer to communicate the input signal to a VCA and a level detection/RMS circuit, each requiring its own blocking capacitor. The RMS signal is compared to a rotation point using conventional comparator circuits. In the AN-116, the compression ratio can be externally programmed to one of six preset values.

Conventional RMS circuits, such as those disclosed by D. Sheingold "Nonlinear Circuits Handbook," Analog Devices, Inc., pp. 398–403, 1976, fall into one of two categories: explicit or implicit. Explicit detectors square the input signal, compute its mean, and then calculate the square root. Squaring the input signal reduces the dynamic range of the detector, and the large number of components needed to implement the explicit detector reduces its accuracy. Implicit detectors use negative feedback in the log domain to produce the RMS signal. By processing the signal in the log domain, the implicit detector has an improved dynamic range. However, the feedback topology limits the practical bandwidth of the detector.

VCAs that are presently available for compression circuits, such as the that described in a product data sheet for a "Voltage-Controlled Amplifier/OVCE," model SSM-2018 produced by Analog Devices, Inc., 1981, use a negative feedback architecture around a gain core stage to produce a differential output current and a differential feedback current. A transresistance stage comprising a pair of resistors responds to a differential input voltage and the differential feedback current to produce a differential voltage. A one pole transconductance stage uses a capacitor to limit the VCA's high frequency gain to stabilize the feedback loop and supply a differential drive current to the gain core stage. The VCA also includes a second gain core stage and a differential pair of transistors for adjusting the effective capacitance of the transconductance stage to maintain a constant loop gain. The second gain core stage and its control circuitry use a large number of components to maintain the loop gain, which increases cost and reduces accuracy.

SUMMARY OF THE INVENTION

The present invention provides a signal conditioning circuit that has a programmable compression ratio in a desired audio range and amplitude limiting and expansion capabilities outside that range. The present circuit requires fewer components and pins on an IC package, uses less capacitance and exhibits better accuracy than prior conditioning circuits.

This is accomplished by merging the buffering and level detection functions into a single input buffer, which produces a rectified version of the input signal and also produces a buffered input that substantially follows the input signal. The rectified signal is applied to an averaging circuit which produces an averaged input. An interface circuit establishes three different compression regions. For normal input signals that are above the noise level and below the level at which signal clipping can occur, the user can select a desired compression ratio. When the input signal becomes large and approaches a level at which clipping can occur, the interface circuit automatically increases the compression ratio to limit the output level; the circuit is preferably designed so that the change in compression ratio occurs at the rotation point. If, on the other hand, the input signal falls so low that it becomes too noisy, the interface circuit reduces the compression ratio to downwardly expand the output level; the circuit is preferably designed so that the change in compression ratio occurs at a break point. In response to the averaged input and its corresponding compression ratio, the interface circuit produces a gain signal. A VCA amplifies the buffered input by an exponential function of the gain signal to produce a compressed output signal. A single capacitor is connected between the VCA and the input buffer to isolate the VCA and rectification circuitry in the buffer from DC variations in the conditioning circuit.

For a better understanding of the invention, and to show how the same may be carried into effect, reference will now be made, by way of example, to the accompanying drawings.

DETAILED DESCRIPTION OF THE INVENTION

The present invention provides a signal conditioning circuit possessing a variable compression capability for audio signals in a desired audio range, a limiting function for preventing distortion of large input signals, and a downward expansion capability for suppressing noise signals. The circuit topology merges the buffering and rectification functions into a single input buffer. The topology reduces the total number of components, which increases the circuit's accuracy and reduces the number of pins on an IC package. The preferred embodiment uses primarily NPN transistors, which are typically faster than PNP transistors, to improve the circuit's speed and reduce signal distortion. Furthermore, the VCA and rectifier can be isolated from DC variations in the conditioning circuit by a single blocking capacitor.

Figure 1:
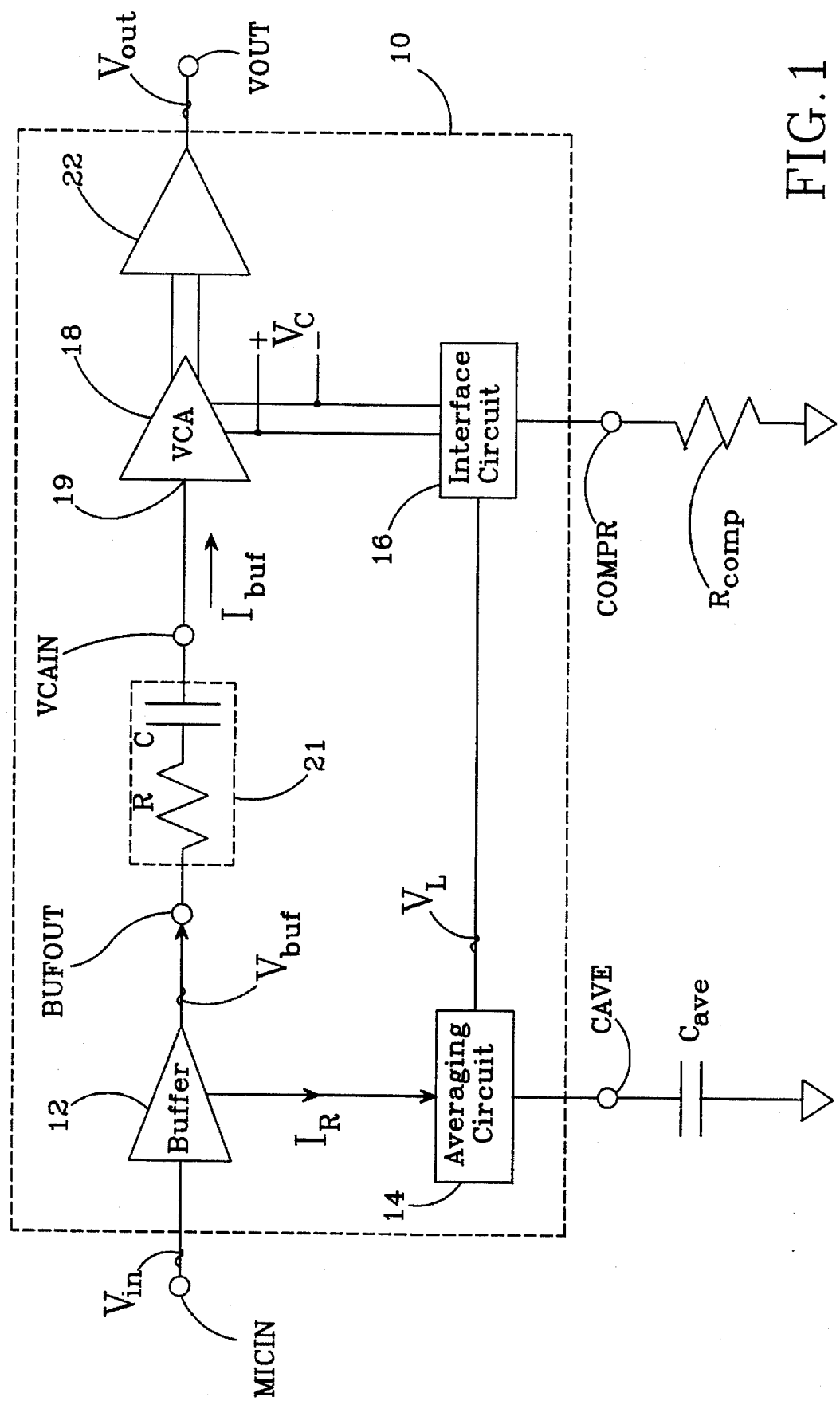
FIG. 1 is a block diagram of a signal conditioning circuit in accordance with the present invention.

FIG. 1 is a block diagram of the present signal conditioning circuit 10. A signal source (not shown), such as a microphone, generates an input signal $V_{in}$ that is applied to the conditioning circuit 10. In response to $V_{in}$, the conditioning circuit 10 produces an averaged input $V_L$ and also produces a buffered input $V_{buf}$ that approximately follows $V_{in}$. In response to the averaged input $V_L$, the conditioning circuit sets a compression ratio, generates an internal gain signal $V_c$, and amplifies the buffered input $V_{buf}$ by an exponential function of the gain signal $V_c$ to provide a compressed output signal $V_{out}$. The conditioning circuit 10 is preferably fabricated as an integrated circuit (IC) and may have as few as 8 pins. The high and low supply voltage pins $V_{dd}$ and GND, respectively, are not shown.

The RMS output signal $V_{out}$ is given by:

$$(V_{out})_{rms} = (V_{in})_{rms} e^{V_c/V_t} \tag{1}$$

which in dB is expressed as:

$$(V_{out})_{dB} = K_1 \frac{V_C}{V_t} + (V_{in})_{dB} \tag{2}$$

where $(V_{in})_{dB}$=20 log$_{10}$($(V_{in})_{rms}$), $(V_{out})_{dB}$=20 log$_{10}$($(V_{out_{rms}}})$, and $K_1$=20 log$_{10}$(e), and e is the natural logarithm base. The change in output level as a function of the change in input level can be derived from equation 2, and is given as follows:

$$\Delta (V_{out})_{dB} = K_1 \frac{\Delta V_C}{V_t} + \Delta (V_{in})_{dB} \tag{3}$$

Using $$\Delta (V_{out})_{dB} = \frac{1}{r} \Delta (V_{in})_{dB}$$

where r is the compression ratio, and solving equation 3 gives:

$$\Delta V_C = \frac{-V_r(r-1)}{K_1 r} \Delta (V_{in})_{dB} \quad (4)$$

In the conditioning circuit, a given value of $V_c$ is chosen to correspond to a reference input level for $(V_{in})_{dB}$. Letting these values be $V_{co}$ and $V_{rp}$, $\Delta V_c = V_c - V_{co}$, and $\Delta (V_{in})_{dB} = (V_{in})_{dB} - (V_{rp})$. The reference input level $V_{rp}$ is commonly referred to as the rotation point. Solving equation 4 provides the control equation for the gain signal $V_c$ that produces the desired compression ratio r:

$$V_C = V_{CO} - \frac{V_r(r-1)}{r} [(V_{in})_{dB} - V_{rp}] \quad (5)$$

To implement the control equation, the input signal $V_{in}$ is applied through the IC's MICIN to an input buffer 12. The buffer merges the normal buffering and rectification functions into a single circuit that produces both the buffered input $V_{buf}$ at a BUFOUT pin and a full-wave rectified version $I_R$ of the input $V_{in}$. The buffer 12 is preferably a voltage follower that presents a high impedance, suitably 100 KΩ, to the signal source to avoid loading the source, and uses negative feedback so that $V_{buf}$ follows $V_{in}$. The buffer includes rectification circuitry that senses $V_{buf}$ to produce the rectification current $I_R$.

An averaging circuit 14 produces the time-averaged voltage $V_L$ in response to the rectified current $I_R$, where $V_L$ is preferably proportional to the log mean-square of $I_R$. The integration period of the averaging circuit is programmed through a pin CAVE with a capacitor $C_{ave}$ connected to CAVE. The sensitivity of $V_L$ to changes in the rectified current is reduced as the capacitance of capacitor $C_{ave}$ is increased.

An interface circuit 16 establishes three different compression regions that define the conditioning circuit's characteristic curve, in which $V_{out}$ in dB is plotted against $V_{in}$ in dB. The slope of the curve in the respective regions is equal to the reciprocal of the compression ratio r associated with that region. For normal input signals that are above the noise level and below the level at which signal clipping can occur, the user can select a desired compression ratio, suitably between 1:1 and 10:1. When the input signal becomes large and approaches a level at which clipping can occur, the interface circuit automatically increases the compression ratio, preferably to approximately infinite compression, to limit the output level; the circuit is preferably designed so that the change in compression ratio occurs at the rotation point. If, on the other hand, the input signal falls so low that it becomes too noisy, the interface circuit reduces the compression ratio, suitably less than 1:1, to downwardly expand the output level; the circuit is preferably designed so that the change in compression ratio occurs at a break point.

The desired audio range is preferably 60 dB, which is satisfied by a circuit design in which the input signal at the rotation point is one thousand times its value at the break point, suitably 1 $V_{rms}$ at the rotation point and 1 m$V_{rms}$ at the break point. The rotation point is preferably slightly below the input level at which clipping or other distortion would occur and the break point is preferably just above the noise floor. This allows the normal compression curve to be used for most of the input range, with excessively large inputs limited and low inputs in the noise range suppressed.

The interface circuit computes the square root of $V_L$ so that to a first order approximation $V_L$ represents $(V_{in})_{dB}$. As described in equation 5, the interface circuit 16 shifts $V_L$ with respect to a rotation point reference voltage $V_{rp}$, scales it in accordance with the compression ratio for the particular region, and adds the reference gain signal $V_{co}$. The square root operation can be carried out in the averaging circuit, but would require additional circuitry. The compression ratio for the normal region, typically between 1:1 and 10:1, is programmed through a COMPR pin by setting the value of an external resistor $R_{comp}$.

A VCA 18 has a current input 19 that is connected to a VCAIN pin. An external load 21, preferably a resistor R in series with a capacitor C, is connected between the buffer's BUFOUT pin and the VCAIN pin. The capacitor C blocks the DC component of the buffered voltage $V_{buf}$ at the BUFOUT pin such that a substantially AC current $I_{buf}$ is supplied to the current input 19 of the VCA. The capacitor also blocks small DC bias currents in the VCA from the buffer's full wave rectifier. The VCA converts the current signal $I_{buf}$ to a voltage signal that follows the input signal $V_{in}$, and amplifies that voltage signal by an exponential function of the gain signal $V_c$ as described above in equation 1. The amplified output of VCA 18 is applied to by a current-to-voltage converter 22 to provide the compressed audio signal $V_{out}$.

Figure 2:
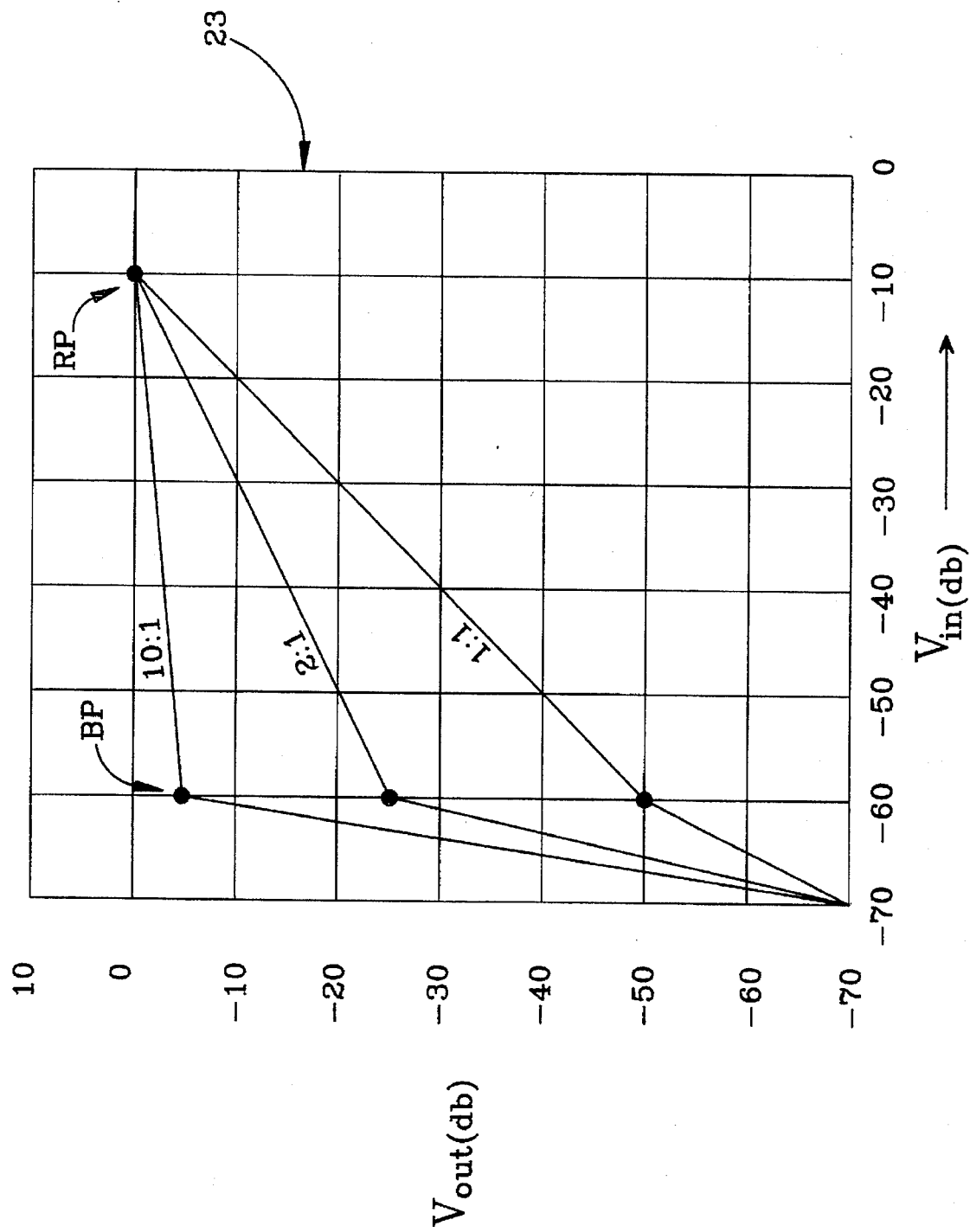
FIG. 2 is a plot of characteristic compression curves for the signal conditioning circuit shown in FIG. 1.

FIG. 2 is a plot of the conditioning circuit's characteristic compression curve 23 described in equation 2 above, illustrating the downward expansion of input signals below the break point BP, programmable compression ratios for input signals in the desired range, and limiting of input signals above the rotation point RP. As shown, the conditioning circuit has a gain of 10 dB at the rotation point RP. The gain signal at this point, and hence the output level, are constant for different compression ratios. Above the rotation point, the output is held substantially constant to avoid distortion and clipping. In the desired input signal range between the rotation point and the breakpoint, the compression of the audio signal can be set between preferably 1:1 and 10:1. For audio signals below the breakpoint, e.g. when a person is not speaking, the compression ratio is reduced (downward expanded) below 1:1 to suppress background noise. These downward expansion, variable compression and limiting functions improve vocal clarity without introducing distortion or amplifying noise signals.

Figure 3:
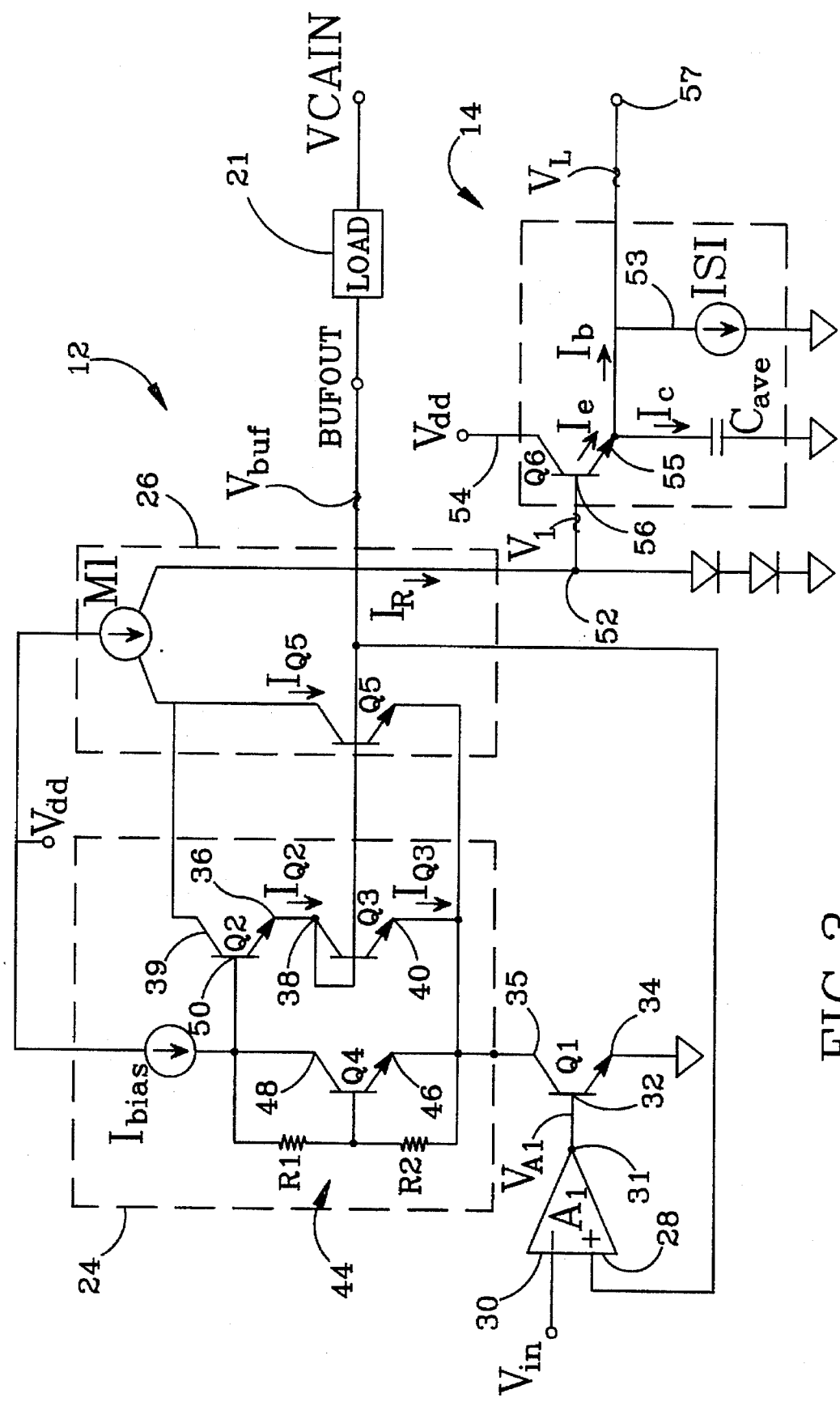
FIG. 3 is a schematic diagram illustrating a preferred implementation of an input buffer and an averaging circuit used in the signal conditioning circuit of FIG. 1.

As shown in FIG. 3, the input buffer 12 is a first stage voltage follower comprising a differential-to-single ended operational amplifier A1, a second stage transistor Q1 and a class AB output stage 24 that are connected in a negative feedback loop, and a summing current mirror 26 which provides the full wave rectified output. The dynamics of the differential amplifier A1 force the voltage at its non-inverting terminal 28 to follow the voltage at its inverting terminal 30. $V_{in}$ is applied to the inverting terminal 30 and the output of the buffer at BUFOUT is fed back to the non-inverting terminal 28, causing the voltage $V_{buf}$ to follow the input signal $V_{in}$ and to be buffered from the signal source by the internal resistance of amplifier A1.

In the preferred embodiment the low voltage supply is at ground reference potential. Thus, the AC input signal $V_{in}$ must be level shifted so that the AC output signal $V_{buf}$ can swing between the low and high voltage supplies without clipping. However, if the low supply is −5 V, level shifting is not be required. Level shifting is accomplished by providing an internal DC offset in amplifier A1 so that the voltage at its non-inverting terminal 28 equals the input voltage $V_{in}$ plus the DC offset.

The amplifier A1 is designed with an internal gain so that a constant input generates a voltage $V_{A1}$ at its output terminal 31 having a nominal value at a bipolar transistor base-emitter differential, approximately 0.7 V. The output voltage $V_{A1}$ is applied to the base 32 of the second stage transistor Q1, turning it on. The emitter 34 of transistor Q1 is connected to ground, and its collector 35 is coupled to the class AB output stage 24. The amplifier A1 responds to an AC input signal $V_{in}$, by perturbing the voltage $V_{A1}$ at base 32, which changes the amount of base current driven into transistor Q1, which in turn changes the transistor's collector current, and as a consequence its collector voltage. The second stage transistor Q1 amplifies the perturbations in the amplifier's output voltage $V_{A1}$ to control the class AB output stage 24.

The class AB output stage 24 comprises an NPN transistor Q2 whose emitter 36 is connected to the base-collector junction 38 of a diode-connected NPN transistor Q3. Transistor Q2's collector 39 is connected to a current mirror M1 which draws current from the high voltage supply $V_{dd}$. The base-collector junction 38 of Q3 is also connected through the BUFOUT pin to the load 21 and is fed back to the non-inverting terminal 28 of amplifier A1. The AC input signal $V_{in}$ modulates the voltage at transistor Q1's collector 35, which is connected to the emitter 40 of transistor Q3, causing transistors Q2 and Q3 to conduct on alternating half cycles of $V_{in}$. Q2 supplies a current $I_{Q2}$ to load 21 while Q3 sinks a current $I_{Q3}$ from the load so that voltage $V_{buf}$ at the BUFOUT pin follows the input voltage $V_{in}$ plus the DC offset.

Ideally, for best performance of the full wave rectifier Q3 is fully off when Q2 is on, and vice versa. However, this causes distortion when the input voltage $V_{in}$ is crossing 0 V. A voltage multiplier 44 is connected in parallel with transistors Q2 and Q3 to supply a bias voltage $V_{bias}$ across the transistors to reduce this crossover distortion.

The voltage multiplier 44 comprises a pair of resistors R1 and R2 that are connected across the base-collector and base-emitter junctions, respectively, of an NPN transistor Q4. The emitter 46 of transistor Q4 is connected to the emitter 40 of transistor Q3, and the collector 48 of transistor Q4 is connected to the base 50 of transistor Q2. A current source $I_{bias}$ supplies current, suitably 50 µA, from the high supply $V_{dd}$ to the multiplier 44 such that $V_{bias}$ is approximately equal to $$\left(1 + \frac{R1}{R2}\right) V_{be},$$

where $V_{be}$ is the base-emitter voltage of transistor Q4. The resistance of resistor R1 is less than that of resistor R2, suitably one quarter of R2, so that $V_{bias}$ is between one and two diode drops. Thus, when either transistor Q2 or Q3 is conducting the other transistor is turned off.

The dynamics of the negative feedback around the buffer circuitry force the voltage at the non-inverting terminal 28 of A1 to follow the voltage at inverting terminal 30 plus the DC offset. Transistor Q1 sinks approximately all of the current $I_{bias}$ flowing through voltage multiplier 44. Thus, transistors Q2 and Q3 idle at very small currents, preferably less than 30 nA. Because transistors Q2 and Q3 idle at very low currents, the class AB output stage is very efficient.

Figure 4A:
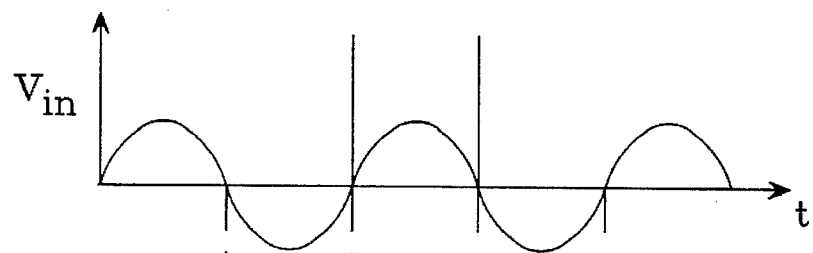
FIGS. 4a, 4b, 4c, 4d and 4e are plots of the input voltage signal, a pair of class AB output stage currents in the input buffer, the buffered voltage signal, and the rectified current, respectively, in the circuit of FIG. 3.
Figure 4B:
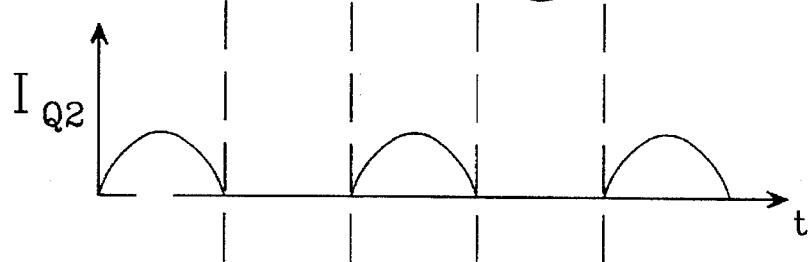
Figure 4C:
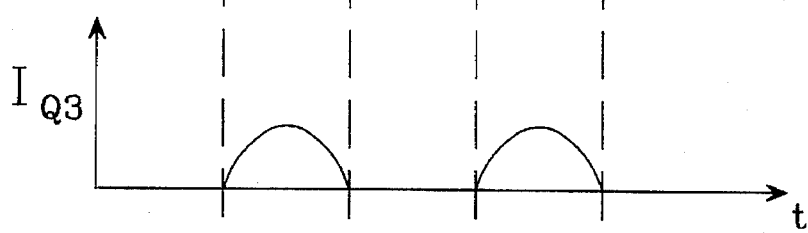
Figure 4D:
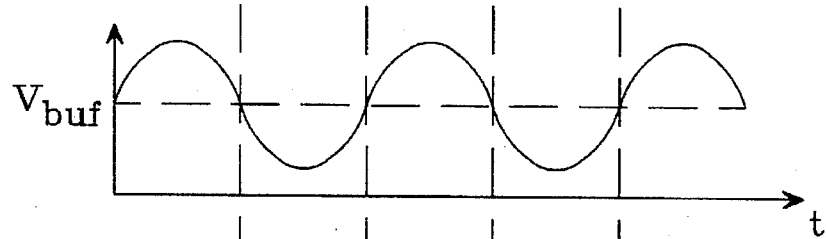

When an AC input signal $V_{in}$, as shown in FIG. 4a, is applied to the inverting terminal 30 of amplifier A1, transistors Q2 and Q3 deliver power to load 21 with each transistor conducting currents $I_{Q2}$ and $I_{Q3}$, respectively, on alternate half cycles of the input signal, as shown in FIGS. 4b-4c. Specifically, when voltage $V_{in}$ at inverting terminal 30 is increasing, amplifier A1 reduces the base current to transistor Q1, which increases the voltage at its collector 35 and pulls up the voltage at the base 50 of Q2. Transistor Q2 turns on and supplies current to load 21 so that $V_{buf}$ increases and follows the input voltage $V_{in}$ plus the DC offset, as shown in FIG. 4d. Conversely, when the voltage $V_{in}$ at inverting terminal 30 is reduced, amplifier A1 drives transistor Q1 harder, which reduces the voltage at its collector 35 and pulls the voltage at the emitter 40 of transistor Q3 down. Transistor Q3 turns on and draws current from load 21 so that $V_{buf}$ is reduced and follows the input voltage $V_{in}$.

Figure 4E:
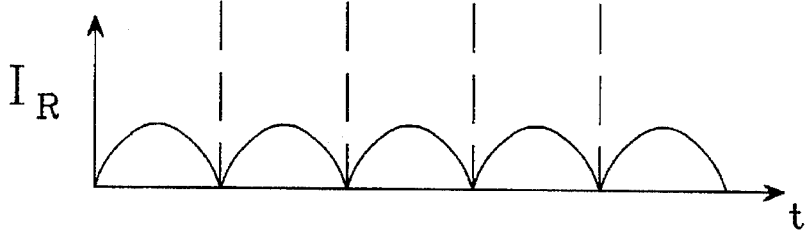

The second function of the input buffer 12 is to produce a full wave rectified version $I_R$ of the current $I_{buf}$ supplied to load 21. Full wave rectification is achieved using an NPN transistor Q5 and the current mirror M1. The base-emitter junction of transistor Q5 is connected across the base-emitter junction of transistor Q3 such that the current $I_{Q5}$ that flows through transistor Q5 replicates the current $I_{Q3}$ flowing through transistor Q3 during the negative half cycle of the input signal $V_{in}$. One branch of current mirror M1 is connected to supply the collector currents for both transistors Q2 and Q5 so that the current mirror M1 conducts during both the positive and negative half cycles of the input signal $V_{in}$, thereby producing the full-wave rectified current $I_R$ (shown in FIG. 4e) through its other branch. The current mirror M1 supplies the current $I_R$ to the averaging circuit 14. By merging the full-wave rectifier with the buffer circuit, the rectifier can directly sense the current $I_{buf}$ supplied to the VCA, which improves the accuracy of the conditioning circuit.

As shown in FIG. 3, the preferred averaging circuit 14 is an explicit log mean-square detector that produces the log mean-square voltage $V_L$ in response to the full-wave rectified input current $I_R$. The rectified current $I_R$ is applied to diodes D1 and D2, that are connected in series between an input node 52 and ground, to produce a log square voltage signal $V_1$ at the input node 52. In general, n diodes could be connected in series to effectively raise the input signal to the $n^{th}$ power. The logarithmic nature of the diodes' I-V (current v. voltage) curves produces the voltage signal $V_1$ that is equivalent to the voltage signal created by the square of the input current $I_R$ flowing through a single diode normalized by the reverse saturation current. The voltage signal $V_1$ is given by:

$$V_1 = 2V_t \ln\left[\frac{I_R}{I_s}\right] = V_t \ln\left[\frac{I_R^2}{I_s^2}\right] \quad (6)$$

where $V_t$ is the thermal voltage and $I_s$ is the diode reverse saturation current. The relation described in equation 6 is valid in forward bias for the base-emitter voltage in a transistor as well as diodes. The diodes in the conditioning circuit are preferably diode connected NPN transistors.

The log square voltage signal $V_1$ is applied to a low pass filter (lpf) 53, preferably a first order filter, which approximately performs the "mean" operation. The filter comprises an NPN transistor Q6, whose collector 54 is connected to the high voltage supply $V_{dd}$, the external capacitor $C_{ave}$ connected between the emitter 55 of Q6 and ground, and a current source IS1 which draws a bias current $I_b$ from the Q6/$C_{ave}$ junction to ground. The voltage signal $V_1$ is applied to the base 56 of Q6 such that a portion of its exponential emitter current $I_e$ is supplied to the capacitor $C_{ave}$. The current source IS1 draws the bias current $I_b$, suitably 3 µA, from $I_e$, producing a net capacitor current $I_c$ that is equal to ($I_e - I_b$). When the emitter current exceeds the bias current, $I_c$ flows into the capacitor $C_{ave}$ and charges it to increase its voltage. Conversely, the capacitor $C_{ave}$ is discharged when the net current $I_c$ is negative.

The filter's cut-off frequency $\omega_0$ is set by the capacitance of capacitor $C_{ave}$, which is nominally 10 µF. Larger capacitances increase the integration time and reduce the cut-off frequency. Conversely, smaller capacitances reduce the integration time and increase the cut-off frequency. In general, the frequency response of a low pass filter is described by the differential equation:

$$\frac{dX}{dt} = -\omega_0 X + \omega_0 I(t) \quad (7)$$

where I(t) is the input to the filter and X is its time response. To a first order approximation, the time response X equals the mean of the input I(t).

The voltage $V_L$ across the capacitor $C_{ave}$, ignoring the effects of base current, is given by the following equations:

$$I_C = C_{ave} \frac{dV_L}{dt} = I_S e^{(V_1 - V_L)/V_t} - I_b \quad (8)$$

Rearranging equation 8, $$\frac{1}{V_t} \frac{dV_L}{dt} e^{V_L/V_t} = -\frac{I_b}{C_{ave} V_t} e^{V_L/V_t} + \frac{I_S}{C_{ave} V_t} e^{V_1/V_t} \quad (9)$$

Substituting $X = e^{V_L/V_t}$ in equation 9 and combining equations 6 and 9 gives:

$$\frac{dX}{dt} = -\frac{I_b}{C_{ave} V_t} X + \frac{I_S}{C_{ave} V_t} \frac{I_R^2}{I_S^2} \quad (10)$$

$$\frac{dX}{dt} = -\omega_0 X + \omega_0 \frac{I_R^2}{I_b I_S} \quad (11)$$

where $$\omega_0 = \frac{I_b}{C_{ave} V_t}.$$

Equation 11 is a differential equation that describes the lowpass filter 53, where X is the time response of the filter to an input $$\frac{I_R^2}{I_b I_S}.$$

Therefore, to a first order approximation, $$X = \text{mean}\left(\frac{I_R^2}{I_b I_S}\right) = \frac{1}{I_b I_S} \text{mean}(I_R^2) \quad (12)$$

Substituting equation 12 into $X = e^{V_L/V_t}$ and solving for $V_L$:

$$V_L = V_t \ln\left(\frac{1}{I_b I_S} \text{mean}(I_R^2)\right) \quad (13)$$

The capacitor voltage $V_L$, which is a logarithmic function of the mean-square input current $I_R$, is provided at an output 57 that is connected to the interface circuit.

Figure 5:
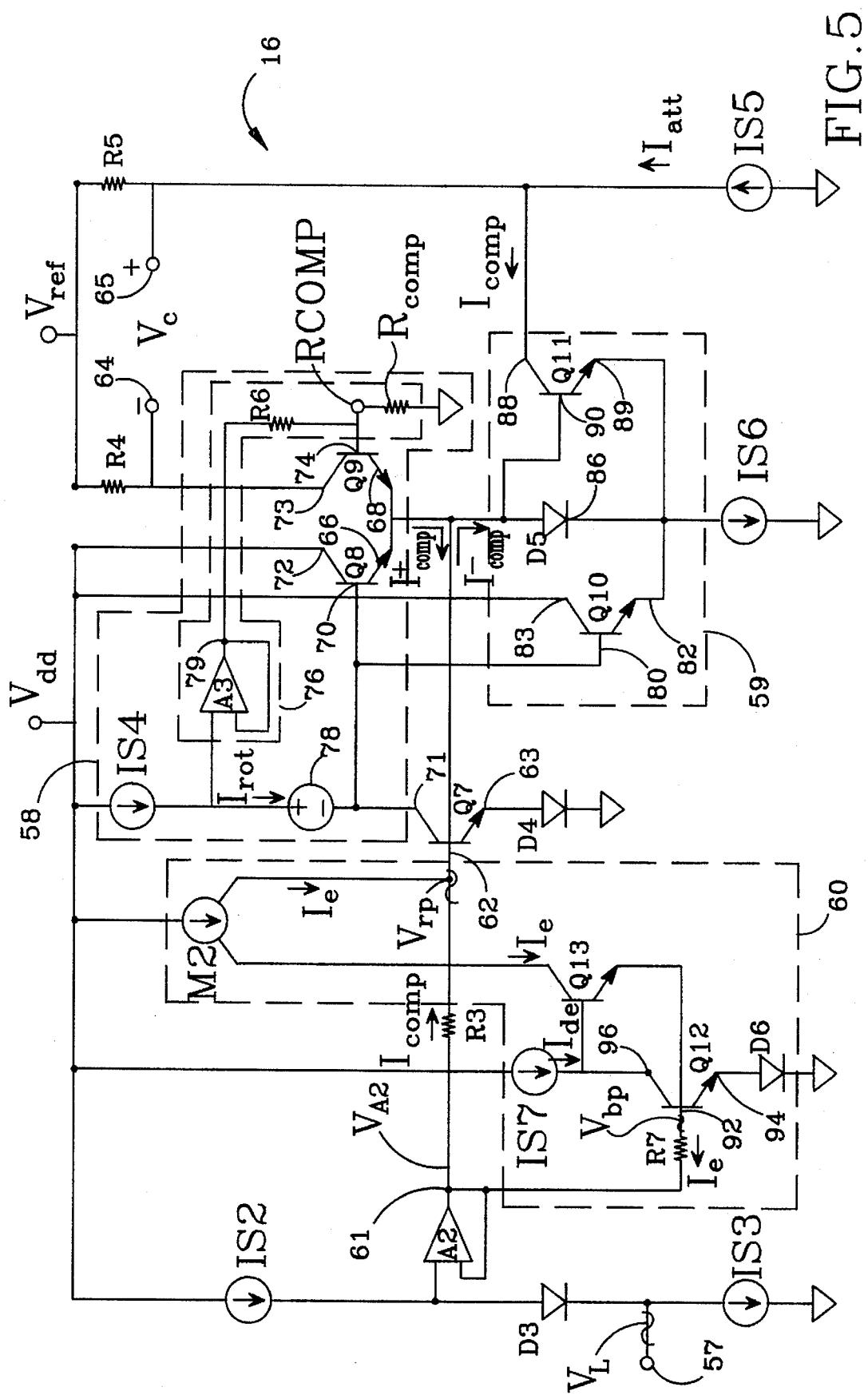
FIG. 5 is a schematic diagram illustrating a preferred implementation of the interface circuit used in the signal conditioning circuit of FIG. 1.

As shown in FIG. 5, the interface circuit 16 preferably comprises a compression circuit 58, a limiting circuit 59 and a downward expansion circuit 60 for generating the gain signal $V_c$ in accordance with equation 5 to achieve the compression ratios for the three different compression regions shown in FIG. 2. The limiting circuit 59 controls $V_c$ for input signals above the rotation point while the compression and downward expansion circuits 58 and 60 are inactive. Similarly, the compression circuit 58 controls the gain signal for input signals between the rotation and break points and the limiting and downward expansion circuits 59 and 60 are inactive. When the input falls below the break point, the compression and downward expansion circuits 58 and 60 control the gain signal.

Voltage $V_L$, the output 57 of the averaging circuit 14 (shown in FIG. 3) is level shifted up by diode D3. The diode D3 is biased at approximately the same quiescent current $I_b$ as transistor Q6 (shown in FIG. 3) by current sources IS2 and IS3, which are connected in series with diode D3 between the high voltage supply $V_{dd}$ and ground. The level shifted voltage $V_L$ is buffered by a voltage following operational amplifier A2 so that one side of a resistor R3, suitably 1.2 KΩ, which is connected to an output terminal 61 of A2, can be held at the shifted voltage level $V_{A2}$ without loading diode D3 and the averaging circuit 14. The voltage $V_{A2}$ at input terminal 61 is given by:

$$V_{A2} = V_t \ln\left(\frac{\overline{I_R^2}}{I_S^2 A^2}\right) \quad (14)$$

where A is the transistor junction area scale factor for diodes D1 and D2, and is suitably equal to 10.

A DC reference voltage $V_{rp}$, which corresponds to the rotation point RP on the characteristic curve 23 shown in FIG. 2, is established at the base 62 of an NPN transistor Q7. A diode D4 is connected between the emitter 63 of transistor Q7 and ground. A current source IS4 supplies bias current $I_{rot}$, suitably between 10 μA and 100 μA, to transistor Q7 and diode D4 so that the reference voltage $V_{rp}$ is equal to $V_{A2}$ when the RMS value of the input signal $V_{in}$ is at the rotation point. The reference voltage is given by:

$$V_{rp} = V_t \ln\left(\frac{I_{rot}^2}{I_S^2}\right) \quad (15)$$

The other side of resistor R3 is connected to the base 62 of transistor Q7 so that the difference between $V_{rp}$ and $V_{A2}$ causes a current $I_{comp}$ to flow through resistor R3. From equations 14 and 15 the current is:

$$I_{comp} = -\frac{V_t}{R3} \ln\left(\frac{\overline{(I_R^2)}}{I_{rot}^2 A^2}\right) \quad (16)$$

From equations 14–16, when the input signal is at the rotation point, $V_{A2} = V_{rp}$, $\overline{I_R^2} = I_{rot}^2 A^2$ and $I_{comp}$ is zero. When $V_{A2}$ is less than $V_{rp}$, $$\sqrt{\overline{(I_R^2)}} < I_{rot} A$$

and $I_{comp}$ is positive (designated as $I_{comp}^+$ in FIG. 5). Conversely, when $V_{A2}$ is greater than $V_{rp}$, $$\sqrt{\overline{(I_R^2)}} > I_{rot} A$$

and $I_{comp}$ is negative (designated as $I_{comp}^-$ in FIG. 5).

The interface circuit 16 supplies a portion of $I_{comp}^+$ and substantially all of $I_{comp}^-$ by drawing current through a pair of resistors R4 and R5, respectively, which are connected between a reference voltage $V_{ref}$, suitably approximately 2.5 V, and negative and positive nodes 64 and 65, respectively. The differential gain signal $V_c$ is developed across nodes 64 and 65, and is controlled by the amount of current flowing through resistors R4 and R5. The compression and downward expansion circuits 58 and 60 direct a portion of $I_{comp}^+$ through R4, which pulls the negative side of the differential gain signal $V_c$ down and increases $V_c$. The limiting circuit 59 directs the current $I_{comp}^-$ through R5, which pulls the positive voltage down and reduces the gain signal $V_c$. A current source IS5 supplies current $I_{att}$, suitably between 0 and 100 μA, to R5 to establish the reference gain signal $V_{co}$. Equivalently, the current source IS5 could draw current from R4.

Drawing the compression currents $I_{comp}^+$ and $I_{comp}^-$ through R4 and R5, respectively, in the manner described produces the differential gain signal $V_c$, which in the compression region is given by:

$$V_C = V_{CO} - \frac{V_T(r-1)}{r} \quad \frac{R4}{R3} \ln \frac{\sqrt{\overline{(Ir^2)}}}{I_{tot}A} \quad (17)$$

The square root of the mean square rectified current is computed by setting the resistance of resistors R4 and R5 to approximately half the resistance of R3, suitably 600 Ω. The ratios of R4 to R3 and R5 to R3 results in the gain signal being effectively multiplied by ½, which is equivalent to taking the square root. Thus, the gain signal $V_c$ generated by the interface circuit 16 satisfies the control relation given in equation 5

The compression circuit 58 comprises a pair of transistors Q8, Q9 whose emitters 66, 68 are connected to the base 62 of transistor Q7 to supply the positive current $I_{comp}^+$. The base 70 of transistor Q8 is connected to the collector 71 of transistor Q7 and its collector 72 is connected to the high voltage supply. The collector 73 of transistor Q9 is connected to the negative node 64, and its base 74 is connected to a voltage divider 76 that sets the compression ratio r, which controls the fraction $$\frac{(r-1)}{r}$$

of the current $I_{comp}^+$ supplied by transistor Q9

When the RMS value of $V_{in}$ is below the rotation point, voltage $V_{A2}$ at input terminal 61 is less than voltage $V_{rp}$ at the base 62 of transistor Q7, which turns transistors Q8 and Q9 on so that they conduct and together supply the current $I_{comp}^+$. The current drawn from the reference voltage through R4 lowers the voltage level at the negative node 64 causing the gain signal $V_c$ to increase. As $V_{A2}$ is further reduced, the gain signal $V_c$ is increased to maintain the nominal compression ratio.

The voltage divider 76 comprises a DC voltage source 78, suitably 0.2 V, which holds the voltage at the output terminal 79 of a voltage follower A3 at approximately 0.2 V above the voltage at the base 70 of transistor Q8. A resistor R6, suitably 1 KΩ, is connected between output terminal 79 and the base 74 of transistor Q9, which is also connected through the COMPR pin to the external resistor $R_{comp}$. With proper selection of the resistance of $R_{comp}$, the voltage at the base 74 of transistor Q9 can be raised above or lowered below the voltage at the base 70 of transistor Q8, so that the fraction $$\frac{(r-1)}{r}$$

of current $I_{comp}^+$ that is supplied by transistor Q9 can be set between approximately 0 and 1. This is equivalent to setting the nominal compression ratio between 1:1 and approximately infinity-to-one.

The limiting circuit 59 comprises a transistor Q10 that keeps transistor Q7 in its active region when $I_{comp}$ is negative and controls the application of $I_{comp}^-$ to resistor R5. Transistor Q10's base 80, emitter 82 and collector 83 are connected to the collector 71 of transistor Q7, a current source IS6, and the high voltage supply, respectively. A diode D5 is connected between the base 62 of transistor Q7 and current source IS6 to supply the current $I_{comp}^-$. The collector 88 of a transistor Q11 is connected to positive node 65, and its base-emitter junction 90 is connected across diode D5 so that transistor Q11 mirrors the current $I_{comp}^-$ flowing through diode D5 to positive node 65.

When $V_{A2}$ is less than $V_{rp}$, transistor Q8 conducts, which holds the voltage at the base 80 of transistor Q10 at approximately a base-emitter voltage above $V_{rp}$. Consequently, diode D5 does not conduct and all of the current from current source IS6 flows through transistor Q10. Conversely, when $V_{A2}$ exceeds $V_{rp}$, transistors Q8 and Q9 turn off. This reduces the voltage at the bases of Q8 and Q10 and consequently at the cathode 86 of diode D5 so that diode D5 conducts and supplies $I_{comp}^-$. Transistor Q11 mirrors $I_{comp}^-$ to node 65 to reduce the gain signal $V_c$. As $V_{A2}$ is increased further, diode D5 conducts more current to supply $I_{comp}^-$, which further reduces the gain signal $V_c$ and maintains the desired compression ratio.

In the preferred embodiment, the limiting circuit increases the compression ratio from the nominal value to infinity by directing all of $I_{comp}^-$ to the positive side of the differential gain signal. Alternatively, a differential pair of transistors and a voltage divider circuit similar to those used in the compression circuit 58 could be used to provide a variable compression ratio for the limiting circuit 59.

The downward expansion circuit 60 sets a DC reference voltage $V_{bp}$ that corresponds to the lower break point BP in the characteristic curve 23 shown in FIG. 2. When $V_{A2}$ falls below $V_{bp}$, the downward expansion circuit 60 supplies a portion of the current $I_{comp}^+$ that flows through R3. This reduces the amount of current supplied by transistors Q8 and Q9. Thus, instead of allowing the compression circuit 58 to increase the gain signal $V_c$ to maintain the nominal compression ratio, the downward expansion circuit 60 reduces $V_c$ so that the compression ratio is less than 1:1.

The downward expansion circuit 60 comprises a resistor R7 that is connected between terminal 61 and the base 92 of an NPN transistor Q12. A diode D6 is connected between the emitter 94 of transistor Q12 and ground. A current source IS7 supplies current $I_{de}$, suitably 1 μA, to transistor Q12's collector 96. The device area scale factor of Q12 and D6 is suitably chosen to be greater than 1, typically 10. Current $I_{de}$ flows through transistor Q12 and diode D6, and establishes the reference voltage $V_{bp}$ at the base 92 of transistor Q12. Transistor Q12 and diode D6 are biased so that the DC reference voltage $V_{bp}$ corresponds to an input signal that is 60 dB less than that corresponding to the DC reference voltage $V_{rp}$.

The base-emitter junction of a transistor Q13 is connected across the collector-base junction of transistor Q12. When $V_{A2}$ is less than $V_{bp}$, transistor Q13 turns on so that it can supply the current $I_e$ flowing through resistor R7. The collector 98 of transistor Q13 is connected to a current mirror M2, which mirrors $I_e$ to the base 62 of Q7, thereby supplying a portion of $I_{comp}^+$. Conversely, when $V_{A2}$ exceeds $V_{bp}$, transistor Q12 saturates and the voltage across the base-emitter junction of Q13 is insufficient to turn it As $V_{A2}$ is reduced, $I_{comp}^+$ and $I_e$ increase. The addition of $I_e$ fights the increase in $I_{comp}^+$ so that the portion of the current supplied by transistors Q8 and Q9 does not increase as rapidly as $I_{comp}^+$. Furthermore, by choosing resistor R7 to have less resistance than resistor R3, $I_e$ increases more rapidly than $I_{comp}^+$. This causes the current in transistor Q9 to actually decrease as $V_{A2}$ falls. The same result can be achieved by setting the resistances of R7 and R3 to be the same and by making mirror M2 have a fixed gain greater than 1. By reducing the portion of $I_{comp}^+$ that is supplied by transistors Q8 and Q9, the downward expansion circuit 60 effectively reduces the compression ratio r, as described in equation 16, from its nominal value to a value less than 1:1.

If $V_{A2}$ falls far enough below $V_{bp}$, $I_e$ will actually exceed $I_{comp}^+$. In this case, the extra current will flow through the limiting circuit 59, resulting in a further reduction of the gain signal $V_c$.

Figure 6:
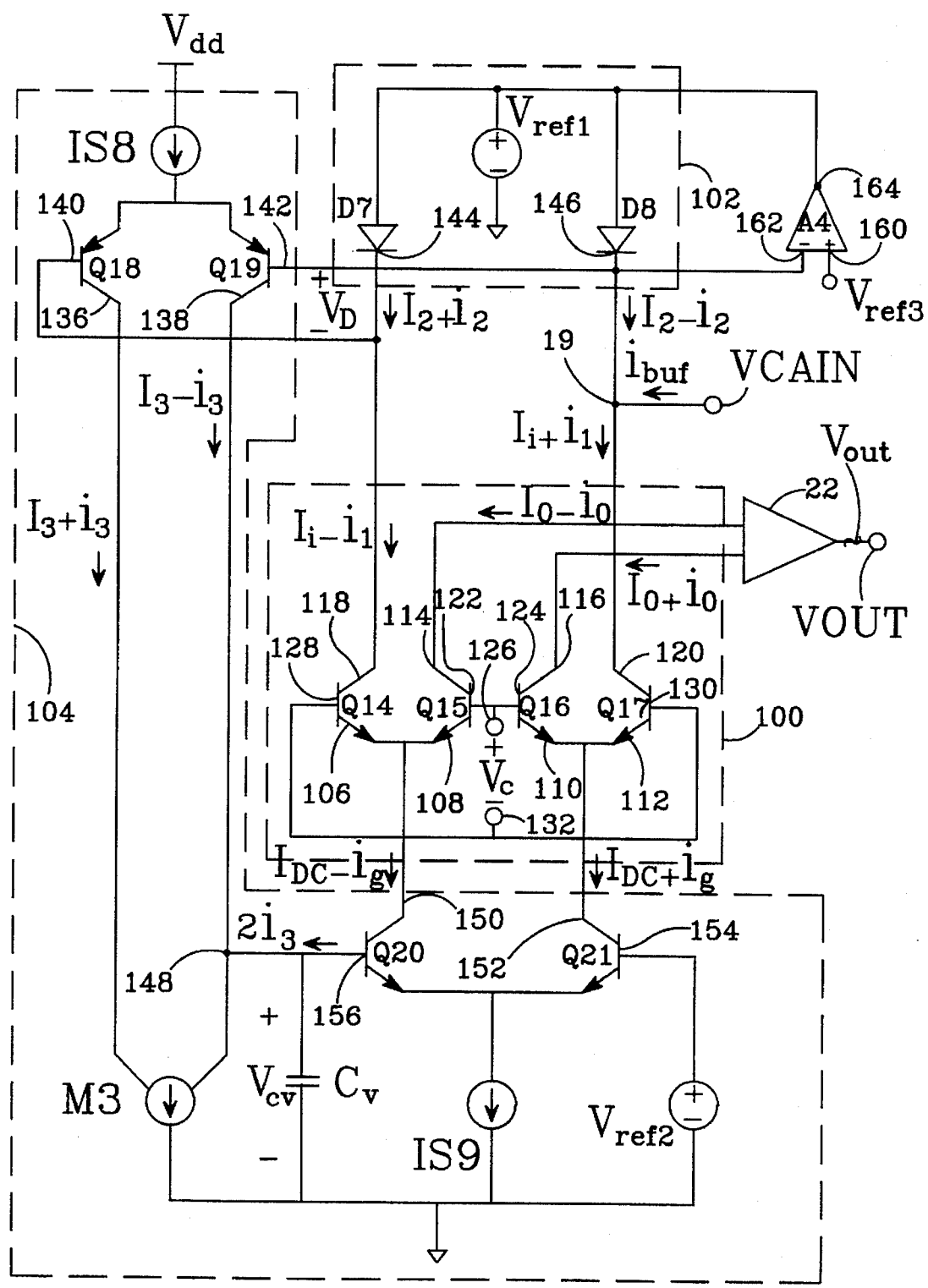
FIG. 6 is a schematic diagram illustrating a preferred implementation of the voltage controlled amplifier used in the signal condition circuit of FIG. 1.

As shown in FIG. 6, the preferred current mode VCA 18 uses a negative feedback architecture around a differential gain core stage 100. For clarity, bias currents are designated with a capital I and AC signal currents are designated with a lower case i. In describing the VCA, the buffer current $I_{buf}$ is given as $i_{buf}$.

The buffer current $i_{buf}$ is injected into the signal path through the VCAIN pin at current input 19 and is converted to a differential voltage $V_D$ by a transresistance stage 102. The voltage $V_D$ is applied to a transconductance stage 104 which limits the VCA's high frequency gain with a capacitor and stabilizes the feedback loop. The transconductance stage supplies a differential drive current ($I_{DC}-i_g$, $I_{DC}+i_g$), where $I_{DC}$ is the gain core's bias current, that drives the gain core stage 100.

The gain core stage 100 produces two differential output currents that sum to the differential drive current supplied to the gain core by the transconductance stage. The fraction of the drive current provided to each output current is controlled by the application of gain signal $V_c$ to the gain core stage 100. A differential feedback current ($I_1-i_1$, $I_1+i_1$) is returned to the transresistance stage 102 to complete the negative feedback loop. A differential output current ($I_0-i_0$, $I_0+i_0$) is applied to the differential current-to-voltage converter 22 to produce output voltage $V_{out}=2Ri_0$ at pin VOUT where R is the resistance of converter 22.

The gain core stage 100 comprises two pair of differentially connected NPN transistors Q14, Q15 and Q16, Q17. The emitters 106 and 108 of transistors Q14 and Q15, respectively, are connected and together supply the tail current $I_{DC}-i_g$, and the emitters 110 and 112 of transistors Q16 and Q17, respectively, are connected and together supply the tail current $I_{DC}+i_g$. The collectors 114 and 116 of transistors Q15 and Q16, respectively, are connected to the current-to-voltage converter 22 to supply the differential output current, and the collectors 118 and 120 of Q14 and Q17, respectively, are connected to the transresistance stage 102 to supply the differential feedback current. The bases 122 and 124 of Q15 and Q16, respectively, are connected at a positive node 126, and the bases 128 and 130 of Q14 and Q17 are connected at a negative node 132.

The gain signal $V_c$ generated by the interface circuit 16 (shown in FIG. 5) is applied across the positive and negative nodes 126, 132 causing the tail currents $I_{DC}-i_g$ and $I_{DC}+i_g$ to be split into the differential feedback and output currents, $I_1 \pm i_1$ and $I_0 \pm i_0$, respectively, where $I_0=GI_{DC}$, $i_0=Gi_g$, $I_1=(1-G)I_{DC}$ and $i_1=(1-G)i_g$. The splitting fraction G varies between 0 and 1 in response to the gain signal $V_c$ according to the following relation:

$$G = \frac{e^{V_c/V_t}}{1+e^{V_c/V_t}} \quad (18)$$

The transresistance stage 102 comprises a pair of diodes D7, D8 that are connected between a reference voltage $V_{ref1}$, approximately 1 V lower than the high voltage supply $V_{dd}$, and the collectors 118 and 120 of transistors Q14 and Q17, respectively. Alternately, the diodes D7 and D8 can be implemented as the emitter-base junctions of a pair of NPN transistors having a common base connection to $V_{ref1}$.

The input current $i_{buf}$ is injected into the signal path at VCAIN between diode D8 and transistor Q17 such that diodes D7 and D8 conduct currents $I_2+i_2$ and $I_2-i_2$, respectively, to produce differential voltage $V_D$. Ignoring base currents, the current flowing from diode D7 is equal to the current supplied to transistor Q14's collector 118, and diode D8's current equals transistor Q17's collector current minus the input current $i_{buf}$. Thus, $$I_2+i_2 = I_1-i_1 \quad (19)$$

and $$I_2-i_2 = I_1+i_1-i_{buf} \quad (20)$$

Solving equations 19 and 20, $$I_2 = I_1 - \frac{i_{buf}}{2} \quad (21)$$

and $$i_2 = -i_1 + \frac{i_{buf}}{2} \quad (22)$$

Equation 22 shows that although the input current $i_{buf}$ is injected into one side of the signal path it is effectively injected differentially. However, as described in equation 21, the bias current $I_2$ has a common mode component of $-i_{buf}/2$. This common mode component is applied to both sides of the signal path and is canceled out by the transresistance stage 102.

The resistance of the transresistance stage is 2r, where r is the dynamic impedance of diodes D7 and D8. The dynamic impedance r is inversely proportional to the bias currents flowing through diodes D7 and D8. Since the bias current flowing through the diodes is provided exclusively from gain core stage 100, the bias current $I_2 = (1-G) I_{DC}$ and $r = V_t/(1-G)I_{DC}$. Thus, the differential voltage $V_D$ measured across the diodes is:

$$V_D = r[(I_2+i_2)-(I_2-i_2)] = \frac{2V_t i_2}{(1-G)I_{DC}} \quad (23)$$

The transconductance stage 104 is a low pass filter, preferably a first order filter, that converts the differential voltage $V_D$ to the differential drive current $I_{DC}-i_g$ and $I_{DC}+i_g$, where $i_g=gm(f)V_D$. The effective transconductance function for a first order low pass filter is:

$$gm(f) = \frac{gm_0}{1+j\frac{f}{f_0}} \quad (24)$$

where f is frequency, $f_0$ is the cutoff frequency and $gm_0$ is the low frequency gain. By rolling off the gain at high frequencies, the second order transistor effects that would otherwise become significant at higher frequencies are reduced to ensure stability.

The transconductance stage 104 comprises a current source IS8, suitably 10 μA, which supplies current to an emitter-coupled pair of PNP transistors Q18 and Q19. This causes bias currents $I_3$, approximately 5 μA, to flow through the collectors 136 and 138 of transistors Q18 and Q19, respectively. The bases 140 and 142 of transistors Q18 and Q19, respectively, are connected to cathodes 144 and 146 of diodes D7 and D8, respectively. Thus, the differential voltage $V_D$ shifts the relative base voltages of transistors Q18 and Q19, causing their collector currents $I_3$ to be perturbed by $+i_3$ and $-i_3$, respectively.

A current mirror M3 is connected to collectors 136 and 138 so that the mirror sinks a current $I_3+i_3$ at a node 148, which is connected to transistor Q19's collector 138. As a result, a current $2i_3$ alternately charges and discharges a capacitor $C_V$, suitably 5 pf, that is connected between node 148 and ground. Because the impedance of the capacitor $C_V$ is reduced at higher frequencies, the gain of the transconductance stage falls off as the frequency is increased.

A current source IS9 supplies tail current, suitably 2 ma, to an emitter-coupled pair of NPN transistors Q20 and Q21, whose collectors 150 and 152 are connected to emitters 106 and 108 of transistors Q14 and Q15, and to emitters 110 and 112 of transistors Q16 and Q17, respectively: this supplies the differential drive current $I_{DC}-i_g$ and $I_{DC}+i_g$, where $I_{DC}$ is nominally 1 ma. A reference voltage $V_{ref2}$, suitably 1 V plus a diode voltage above ground, is connected to base 154 of transistor Q21. Base 156 of transistor Q20 is connected to node 148 at the top of capacitor $C_V$. The base currents of transistors Q20 and Q21 are assumed zero; however, in practice this can be ensured by using Darlington pairs in place of Q20 and Q21.

At DC ($i_{buf}$=0), the capacitor voltage $V_{C_V}$ is substantially equal to $V_{ref2}$, so that the tail current $2I_{DC}$ is split evenly between transistors Q20 and Q21 and $i_g$=0. When the input current $i_{buf}$ is positive, $V_D$ is positive, and $2i_3$ discharges capacitor $C_V$. This lowers the voltage at transistor Q20's base relative to the voltage at transistor Q21's base and reduces the current flowing through Q20 by $i_g$. This in turn reduces the differential feedback current by $i_1$, which fights the positive input current $i_{buf}$. Conversely, when $i_{buf}$ is negative the capacitor $C_V$ is charged and a larger portion of the current flows through transistor Q20 providing the negative feedback that fights the negative input current.

The output voltage $V_{out}$ produced by the current-to-voltage converter 22 in response to the differential drive current is described by:

$$V_{out} = 2GRi_g \quad (25)$$

The drive current $i_g$ produced by the transconductance stage 104 is given by:

$$i_g = gm(f)V_D \quad (26)$$

Substituting equations 23 and 22, $i_1$=(1−G) $i_g$, and solving for $i_g$ produces:

$$i_g = \frac{\frac{1}{(1-G)}}{1+\frac{I_{DC}}{2V_t gm(f)}} \times \frac{i_{buf}}{2} \quad (27)$$

Substituting $i_g$ into equation 25, using $$\frac{G}{(1-G)} = e^{V_c/V_t}$$

and rearranging gives:

$$V_{out} = H(f)e^{V_c/V_t}Ri_{buf} \quad (28)$$

where $$H(f) = \frac{1}{1+\frac{(1+jf/f_0)I_{DC}}{2gm_0 V_t}} \quad (29)$$

and $$V_{in} = Ri_{buf} \quad (30)$$

When the loop gain 2 $gm_0 V_t/I_{DC}$ is much greater than 1, H(f) is approximately 1 and the input/output gain function described in equation 28 is the desired exponential function of $V_C$ given originally in equation 1. Furthermore, the loop gain is held constant regardless of the amount of gain extracted from the VCA. Thus, the VCA can provide the desired 60 dB of gain up to approximately 100 Khz for a typical IC process.

Additionally the signal distortion shown by transistors, specifically the PNP emitter-coupled pair (Q18, Q19) in the transconductance stage 104, in response to large input signals is substantially canceled by the opposing distortion in the transresistance stage diodes (D7, D8).

Control feedthrough is introduced by the fact that input node 19 moves in response to gain changes. The addition of op amp A4 holds node 19 constant with gain changes. Its non-inverting 160 input is connected to a reference $V_{ref3}$, which is suitably equal to or more positive than $V_{ref}$ in FIG. 5. The inverting input 162 is connected to node 19. The output 164 of op amp A4 is connected to the anode of diodes D7 and D8 or preferably the bases of npn transistors used in place D7 and D8 as mentioned earlier. This establishes a negative feedback loop around op amp A4 that causes node 19 to be held at the same potential as $V_{ref3}$. Not only is control feedthrough minimized in this way, but the input impedance of the VCA is greatly reduced which improves the accuracy of the voltage-to-current conversion via the resistor/capacitor combination 21 shown in FIG. 1.

While several illustrative embodiments of the invention have been shown and described, numerous variations and alternate embodiment will occur to those skilled in the art. Such variations and alternate embodiments are contemplated, and can be made without departing from the spirit and scope of the invention as defined in the appended claims.

We claim:

1. An analog circuit for conditioning an input signal in accordance with a compression ratio, comprising:
   a single analog input buffer having primary and secondary output terminals, said input buffer responding to an input signal by a) producing a buffer signal at said primary output terminal that follows said input signal and b) directly sensing and rectifying the buffer signal at said primary output terminal to produce a rectified signal at said secondary output terminal that more accurately represents the buffer signal than it does the input signal;
   an analog averaging circuit that produces an averaged signal from said rectified signal;
   an analog interface circuit that produces a gain signal that is a function of said averaged signal and said compression ratio; and
   a voltage controlled amplifier (VCA) connected to amplify the buffer signal by an exponential function of said gain signal to produce a compressed output signal that is more accurate than it would have been if the input signal were directly sensed and rectified to produce the rectified signal.

2. A circuit for conditioning an input signal in accordance with a compression ratio, comprising:
   an input buffer having an output terminal, said input buffer responding to an input signal by producing a buffer signal at said output terminal that follows said input signal and also producing a rectified input signal;
   an averaging circuit that produces an averaged signal from said rectified input signal, said averaging circuit having a programmable input that selects an integration period for averaging said rectified input signal;
   an interface circuit that produces a gain signal that is a function of said averaged signal and said compression ratio; and
   an amplifier connected to amplify the buffer signal by an exponential function of said gain signal to produce a compressed output signal.

3. An analog circuit for conditioning an input signal in accordance with a compression ratio, comprising:
   an analog input buffer having primary and secondary output terminals, said input buffer responding to an input signal by a) producing a buffer signal at said primary output terminal that follows said input signal and b) directly sensing and rectifying the buffer signal at said primary output terminal to produce a rectified signal at said secondary output terminal that more accurately represents the buffer signal than the input signal;

an analog averaging circuit that produces an averaged signal from said rectified signal;

an analog interface circuit that produces a gain signal that is a function of said averaged signal and said compression ratio, said interface circuit providing fixed and selectable compression ratios when the input signal lies above and below a rotation point, respectively, and having a programmable input that selects said compression ratio when the input signal lies below said rotation point; and a voltage controlled amplifier (VCA) connected to amplify the buffer signal by an exponential function of said gain signal to produce a compressed output signal that is more accurate than it would have been if the input signal were directly sensed and rectified to produce the rectified signal.

4. A circuit for conditioning an AC input signal in accordance with a compression ratio, comprising:

an input buffer having an output terminal, said input buffer responding to an input signal by producing a buffer signal at said output terminal that follows said input signal and also producing a rectified current signal; said input buffer comprising, a differential-to-single ended input stage having first and second inputs and an output, said input stage producing a drive signal at said output in response to said AC input signal being applied to said first input, said second input being connected to the buffer's output terminal to provide a feedback path;

an output stage comprising first and second active devices that conduct source and sink currents, respectively, on alternate half cycles of said AC input signal in response to said drive signal to alternately source and sink current to said output terminal such that said buffer signal approximately follows said AC input signal; and a full-wave rectifier that senses said source and sink currents to produce said rectified current signal;

an averaging circuit that produces an averaged signal from said rectified current signal;

an interface circuit that produces a gain signal that is a function of said averaged signal and said compression ratio; and an amplifier connected to amplify the buffer signal by an exponential function of said gain signal to produce a compressed output signal.

5. A circuit in accordance with claim 4, wherein said differential-to-single ended input stage establishes a DC offset voltage between its first and second inputs so that said buffered input signal is level shifted by said DC offset voltage.

6. A signal conditioning circuit for conditioning an input signal in accordance with a compression ratio, comprising:

an input buffer having primary and secondary output terminals, said input buffer responding to an input signal by producing a buffer signal at said primary output terminal that follows said input signal, said input buffer comprising a full-wave rectifier that directly senses and rectifies the buffer signal at said primary output terminal to produce a rectified input signal at said secondary output terminal that more accurately represents the buffer signal than the input signal;

an averaging circuit that produces an averaged signal from said rectified input signal;

an interface circuit that produces a gain signal that is a function of said averaged signal and said compression ratio;

a voltage controlled amplifier (VCA) connected to amplify the buffer signal by an exponential function of said gain signal to produce a compressed output signal that is more accurate than it would have been if the input signal were directly sensed and rectified to produce the rectified signal; and a single capacitor that is connected between the input buffer's primary output terminal and said VCA to simultaneously block the DC component of the buffer signal applied to a) the VCA from the buffer's primary output and b) the buffer's full-wave rectifier due to DC variations in the buffer and the VCA.

7. A circuit in accordance with claim 4, said full-wave rectifier comprising:

a sensing transistor that produces a sensing current, in response to said drive signal, that substantially replicates the sink current flowing through said second active device; and a current mirror that supplies said sink current to said first active device and supplies said sensing current to said sensing transistor on alternate half-cycles of said input signal to produce said rectified current signal and for mirroring it to said averaging circuit.

8. A circuit in accordance with claim 7, wherein said first active device is an NPN transistor having a collector which draws current from said current mirror, and an emitter that supplies the source current to said output terminal, and said second active device is a diode-connected NPN transistor having a base-collector junction that draws said sink current from said output terminal.

9. A circuit in accordance with claim 8, wherein said diode connected NPN transistor has an emitter, said sensing transistor comprising a sensing NPN transistor having a base and an emitter that are connected to said diode connected transistor's base-collector junction and emitter, respectively, and a collector that draws said sensing current from said current mirror.

10. A circuit for conditioning an input signal in accordance with a compression ratio, said circuit having a characteristic compression curve that relates its compressed output signal to the input signal, comprising:

an input buffer having an output terminal, said input buffer responding to an input signal by producing a buffer signal at said output terminal that follows said input signal and also producing a rectified input signal;

an averaging circuit that produces an averaged signal from said rectified input signal;

an interface circuit that produces a gain signal that is a function of said averaged signal and said compression ratio, said interface circuit comprising, a biasing circuit that establishes a rotation point on said characteristic compression curve;

a comparator that compares said averaged signal to said rotation point;

a compression circuit that establishes a nominal value for said compression ratio, and scales said averaged signal in accordance with said nominal value to produce said gain signal when said input signal is less than said rotation point; and a limiting circuit that increases said compression ratio to a limiting value and scales said averaged signal in accordance with said limiting value to reduce said gain signal when the input signal exceeds said rotation point; and an amplifier connected to amplify the buffer signal by an exponential function of said gain signal to produce a compressed output signal.

11. A circuit in accordance with claim 10, wherein said compression circuit has a programmable input for selecting said nominal value.

12. A circuit in accordance with claim 10, said interface circuit further comprising:

a downward expansion circuit that establishes a breakpoint that lies below said rotation point on said characteristic compression curve, and reduces the value of said compression ratio when the averaged signal is less than said breakpoint.

13. A circuit in accordance with claim 12, wherein said downward expansion circuit comprises a current mirror with fixed gain that determines a rate at which said compression ratio is reduced.

14. A circuit in accordance with claim 12, wherein said downward expansion circuit comprises a resistor whose resistance determines a rate at which said compression ratio is reduced.

15. A circuit in accordance with claim 10, wherein said rotation point corresponds to a high reference voltage, said interface circuit includes an input terminal for receiving said averaged signal, said first biasing circuit includes a biasing transistor having a base, said biasing circuit establishing said high reference voltage at the biasing transistor's base, said comparator including a first input resistor that is connected between the biasing transistor's base and said input terminal such that a positive current flows through said first input resistor when said averaged signal is less than said high reference voltage, and said compression circuit comprising first and second compression transistors that together supply said positive current, with a known fraction of said positive current flowing through said second compression transistor in accordance with said nominal compression ratio to provide said gain signal.

16. A circuit in accordance with claim 15, wherein said gain signal is a gain voltage, said compression circuit further comprising:

a reference voltage node; and a first output resistor connected between said reference voltage node and said second compression transistor such that said known fraction of said positive current flows through said first output resistor and provides said gain voltage.

17. A circuit in accordance with claim 16, wherein said averaged signal is proportional to the log mean square of the rectified input signal, said first output resistor has substantially one-half the resistance of said first input resistor such that the gain voltage is proportional to the log root-mean-square of said input signal.

18. A circuit in accordance with claim 15, said compression circuit further comprising a programmable voltage divider that is connected to said second compression transistor, and selects the nominal compression ratio by setting the known fraction of the positive current flowing through said second compression transistor.

19. A circuit in accordance with claim 15, wherein said gain signal is a differential gain signal that is formed as the difference between the known fraction of the positive current flowing through said second compression transistor and a limiting current, said limiting circuit comprising:

a sensing circuit that senses when said averaged signal exceeds said high reference voltage and causes a negative current to flow through said first input resistor, and that produces a control signal;

a limiting circuit that supplies said negative current in response to said control signal; and a mirror circuit that mirrors a portion of said negative current to produce said limiting current at a level that increases said compression ratio to said limiting value.

20. A circuit in accordance with claim 19, wherein said differential gain signal is a differential gain voltage, and said second compression transistor and said mirror circuit have respective output nodes, said interface circuit further comprising:

a reference voltage node;

a first output resistor that is connected between said reference voltage node and said second compression transistor's output node; and a second output resistor that is connected between said reference voltage node and said mirror circuit's output node, said differential gain voltage being developed across said output nodes in response to said known fraction of said positive current flowing through the first output resistor and said limiting current flowing through said second output resistor.

21. A circuit in accordance with claim 20, wherein the resistances of said first and second output resistors are approximately one-half the resistance of said first input resistor.

22. A circuit in accordance with claim 15, said interface circuit further comprising:

a downward expansion circuit that establishes a break point that lies below said rotation point on said characteristic compression curve, and reduces the value of said compression ratio when the input signal is less than said break point.

23. A circuit in accordance with claim 22, wherein said breakpoint corresponds to a low reference voltage, said downward expansion circuit comprising:

a second biasing circuit comprising a second bias transistor having a base, said second biasing circuit establishing said low reference voltage at the base of said second bias transistor;

a second input resistor that is connected between said second bias transistor's base and the interface circuit's input terminal such that an expansion current flows through said second input resistor when said averaged signal is less than said low reference voltage; and a current mirror that mirrors said expansion current to the base of said first biasing transistor to supply a portion of the positive current, thereby reducing the current flowing through said second compression transistor, which in turn reduces the gain signal and said compression ratio.

24. A circuit in accordance with claim 23, wherein the resistance of said second input resistor is less than the resistance said first input resistor such that said expansion current increases faster than said positive current as the averaged signal is reduced.

25. A circuit for conditioning an input signal in accordance with a compression ratio, comprising:

a input buffer having primary and secondary output terminals, said input buffer responding to an input signal by a) producing a buffer signal at said primary output terminal that follows said input signal and b) directly sensing and rectifying the buffer signal at said primary output terminal to produce a rectified input signal at said secondary output terminal that more accurately represents the buffer signal than the input signal;

an averaging circuit that produces an averaged signal from said rectified input signal, said averaging circuit comprising:

a log converter for producing a log signal response to said rectified signal;

a first multiplier for producing a log power signal as the log of the input signal raised to a known power factor by scaling said log signal by said known power factor; and a log filter for producing said averaged signal as a log mean-power signal by averaging said log power signal;

an interface circuit that produces a gain signal that is a function of said log mean-power signal and said compression ratio, said interface circuit producing fixed and selectable compression ratios when the input signal lies above and below a rotation point, respectively, said interface circuit having a programmable input for selecting said compression ratio when the input signal lies below said rotation point; and a voltage controlled amplifier (VCA) connected to amplify the buffer signal by an exponential function of said gain signal to produce a compressed output signal that is more accurate than it would have been if the input signal were directly sensed and rectified to produce the rectified signal.

26. A circuit in accordance with claim 25, wherein said input signal is an input current signal and said log power signal is a log power voltage signal, said log converter and said first multiplier comprising n diodes that are connected in series, said input current signal flowing through said diodes to produce said log power voltage signal, said power factor being equal to the number of diodes n.

27. A circuit in accordance with claim 26, wherein said log filter is a first order low pass filter and said log mean-power signal is a log mean-power voltage signal, said low pass filter comprising:

a first transistor that produces an exponential current in response to said log power voltage signal;

a current source that provides a bias current that subtracts from said exponential current; and a capacitor that is charged by the difference between said exponential and bias currents to produce said log mean-power voltage signal.

28. A circuit in accordance with claim 27, wherein n is 2 and said log mean-power voltage signal is a log mean-square voltage signal.

29. A circuit for conditioning an input signal in accordance with a compression ratio, comprising:

an input buffer having an output terminal, said input buffer responding to an input signal by producing a buffer signal at said output terminal that follows said input signal and also producing a rectified input signal;

an averaging circuit that produces an averaged signal from said rectified input signal, an interface circuit that produces a gain signal that is a function of said averaged signal and said compression ratio; and a voltage controlled amplifier (VCA) connected to amplify the buffer signal by an exponential function of said gain signal to produce a compressed differential output current, said VCA comprising, a gain core stage that produces a differential feedback current and said differential output current in response to a differential drive current and said gain signal;

a transresistance stage having a dynamic impedance that varies in accordance with said gain signal such that the loop gain of said VCA is approximately constant, said buffered input signal being injected with said differential feedback current to produce a differential voltage across said dynamic impedance; and a transconductance stage that low pass filters the differential voltage and supplies said differential drive current.

30. A circuit in accordance with claim 29, wherein said gain core stage comprises two pair of differentially connected transistors Q14, Q15 and Q16, Q17 which have respective bases and current circuits that supply said differential drive current, said gain signal being applied differentially across the bases of both transistor pairs such that a fraction G of said differential drive current flows through the current circuits of transistors Q15 and Q16 to supply said differential output current and a fraction (1–G) of said differential drive current flows through the current circuits of transistors Q14 and Q17 to produce said differential feedback current.

31. A circuit in accordance with claim 30, wherein the dynamic impedance of said transresistance stage is inversely proportional to (1–G) such that said differential voltage is insensitive to said gain signal.

32. An analog circuit for conditioning an input signal in accordance with a compression ratio, comprising:

an analog input buffer having primary and secondary output terminals, said input buffer responding to an input signal by a) producing a buffer signal at said primary output terminal that follows said input signal and b) directly sensing and rectifying the buffer signal at said primary output terminal to produce a rectified input signal at said secondary output terminal that more accurately represents the buffer signal than the input signal;

an analog averaging circuit that produces an averaged signal in response to said rectified signal;

an analog interface circuit that produces a gain signal that is a function of said averaged signal and said compression ratio, said interface circuit comprising a compression circuit that has a programmable input for selecting a nominal value for said compression ratio, a limiting circuit that increases the value of said compression ratio when said input signal exceeds a rotation point, and a downward expansion circuit that reduces the value of said compression ratio when said input signal is less than a break point; and a voltage controlled amplifier (VCA) connected to amplify the buffer signal by an exponential function of said gain signal to produce a compressed output signal that is more accurate than it would have been if the input signal were directly sensed and rectified to produce the rectified signal.

33. A circuit for conditioning an input signal in accordance with a compression ratio, said circuit having a characteristic compression curve that relates its compressed output signal to the input signal, comprising:

an input buffer having an output terminal, said input buffer responding to an input signal by producing a buffer signal at said output terminal;

an averaging circuit that produces an averaged signal in response to said input signal;

an interface circuit that produces a gain signal that is a function of said averaged signal and said compression ratio, said interface circuit comprising:

an input terminal for receiving said averaged signal, a compression circuit that establishes a nominal value for said compression ratio, a limiting circuit that includes:

a first biasing circuit that establishes a rotation point on said characteristic compression curve, and a first comparator that compares said averaged signal to said rotation point and increases the value of said compression ratio when said averaged signal exceeds the rotation point;

a downward expansion circuit that includes a second bias circuit that establishes a break point that lies below said rotation point on said characteristic curve; and a second comparator that compares said averaged signal to said break point and reduces the value of said compression ratio when said averaged signal is less than said break point; and an amplifier connected to amplify the buffered signal by an exponential function of said gain signal to produce a compressed output signal.

34. A circuit in accordance with claim 33, wherein said rotation point is a high reference voltages, said first comparator including a first input resistor connected between said input terminal and said first biasing circuit such that a compression current flows through said first input resistor when said averaged signal is less than said high reference voltage, and said compression circuit comprising first and second compression transistors that together supply said compression current, with a known fraction of said positive current flowing through said second compression transistor in accordance with said nominal compression ratio to provide said gain signal.

35. A circuit in accordance with claim 34, wherein said break point is a low reference voltage, said second comparator including a second input resistor connected between said input terminal and said second biasing circuit such that a downward expansion current flows through said second input resistor when said averaged signal is less than said low reference voltage, said downward expansion circuit comprising a current mirror that mirrors said downward expansion current to said first biasing circuit to supply a portion of said compression current, thereby reducing the current flowing through said second compression transistor, which in turn reduces the gain signal and said compression ratio.

36. A circuit in accordance with 35, said limiting circuit comprising:

a sensing circuit that senses when said averaged signal exceeds said high reference voltage and causes a limiting current to flow through said first input resistor, and that produces a control signal;

a limiting circuit that supplies said limiting current in response to said control signal; and a mirror circuit that mirrors a portion of said limiting current to reduce said gain signal and said compression ratio.

* * * * *